(12) United States Patent
Lin

(10) Patent No.: US 7,541,876 B2
(45) Date of Patent: Jun. 2, 2009

(54) AMPLIFIER AND METHOD FOR OPERATING THE SAME

(75) Inventor: Chih-I Lin, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 60 days.

(21) Appl. No.: 11/837,951

(22) Filed: Aug. 13, 2007

(65) Prior Publication Data

US 2009/0045879 A1    Feb. 19, 2009

(51) Int. Cl.
   *H03F 3/04*    (2006.01)
(52) U.S. Cl. .................................. 330/311; 330/310
(58) Field of Classification Search ............... 330/311, 330/310, 288; 323/315, 316
   See application file for complete search history.

(56) References Cited

U.S. PATENT DOCUMENTS

| 4,480,230 | A | * | 10/1984 | Brehmer et al. | 330/255 |
| 6,600,377 | B2 | * | 7/2003 | Sasaki | 330/311 |
| 6,636,119 | B2 | * | 10/2003 | Vathulya | 330/311 |
| 7,391,269 | B2 | * | 6/2008 | Chiba | 330/311 |

* cited by examiner

*Primary Examiner*—Henry K Choe
(74) *Attorney, Agent, or Firm*—Slater & Matsil, L.L.P.

(57) ABSTRACT

An amplifier includes an input terminal, an output terminal, a cascode circuit with a first and a second transistor serially coupled between an output terminal and a terminal of a predefined potential with a control terminal of the first transistor being coupled to the input terminal, a first bipolar transistor having a collector/emitter path, forming a series circuit coupled to the terminal of a predefined potential with the first transistor, a power supply circuit for providing power supply voltages over a cascode circuit and a series circuit and a second bipolar transistor coupled between the output terminal and the terminal of the predefined potential with bases of the first bipolar transistor and the second bipolar transistor being coupled to each other and a current source.

14 Claims, 2 Drawing Sheets

AMPLIFIER AND METHOD FOR OPERATING THE SAME

TECHNICAL FIELD

The present invention relates to an amplifier and a method for operating the amplifier.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Figure 1:
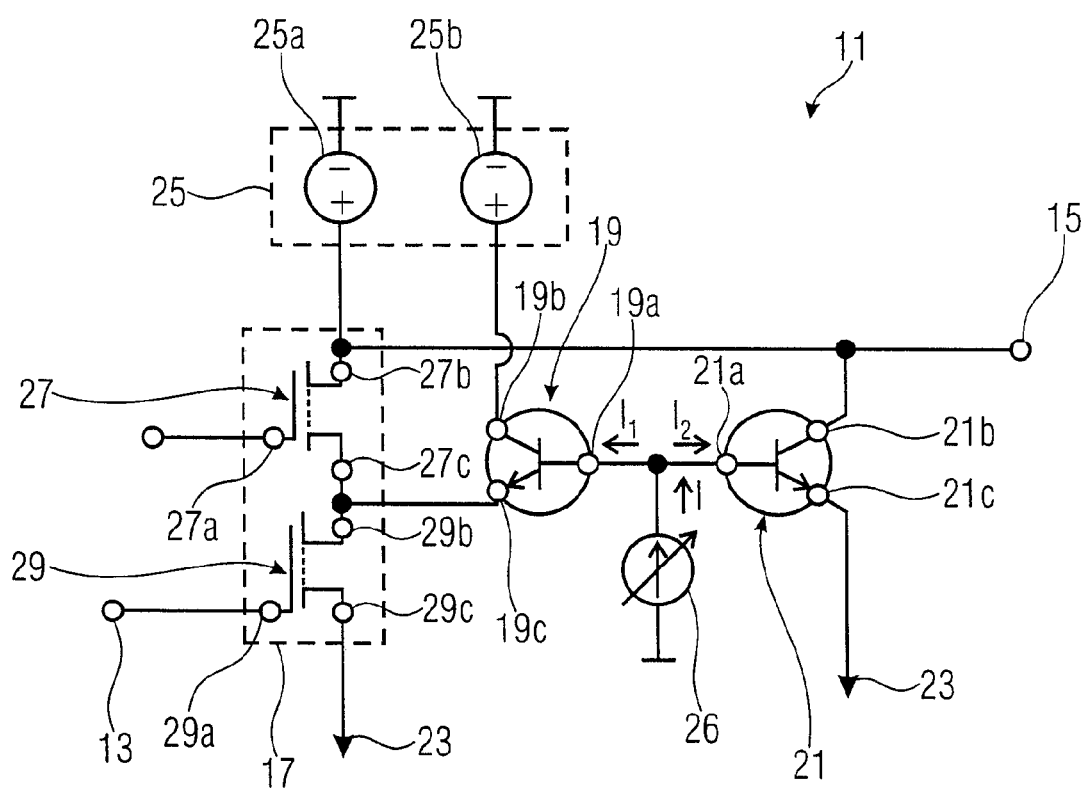
FIG. 1 shows an amplifier according to an embodiment.

FIG. 1 discloses an amplifier 11 according to an embodiment. The amplifier 11 has an input terminal 13, an output terminal 15, a cascode circuit 17, a first bipolar transistor 19, a second bipolar transistor 21, a terminal 23 of a predefined potential and a power supply circuit 25. The cascode circuit 17 comprises a first transistor 27 or a cascode transistor 27 having a control terminal 27a, a first terminal 27b and a second terminal 27c and a second transistor 29 or an amplifier transistor 29 having a control terminal 29a, a first terminal 29b and a second terminal 29c. The first bipolar transistor 19 has a base terminal 19a, a collector terminal 19b and an emitter terminal 19c, while the second bipolar transistor 21 has a base terminal 21a, a collector terminal 21b and an emitter terminal 21c. The power supply circuit 25 comprises a first voltage source 25a and a second voltage source 25b.

The input terminal 13 is connected to the control terminal 29a of the amplifier transistor 29 and the second terminal 29c of the amplifier transistor 29 is coupled to the terminal 23 of the predefined potential. The second terminal 29c of the amplifier transistor 29 is connected to the base terminal 19a of the first bipolar transistor and the first terminal of the cascode transistor 27. The second terminal 27c of the cascode transistor 27 is coupled to the output terminal 15 and a first terminal of the first voltage source 25a. The second terminal of the first voltage source 25a is connected to a ground terminal while the collector terminal 19b of the first bipolar transistor 19 is coupled to a first terminal of the second voltage source 25b. Apart from this, a second terminal of the second voltage source 25b is coupled to the ground terminal.

Additionally, the base terminal 19a of the first bipolar transistor 19 is connected to the base terminal 21a of the second bipolar transistor 21 and the emitter terminal 21c of the second bipolar transistor 21 is coupled to the output terminal 15. The emitter terminal 21c of the second bipolar transistor 21 is connected to the terminal 23 of the predefined potential. A first terminal of a current source 26 is coupled to the bases 19a, 21a and a second terminal of the current source 26 is connected to the ground terminal.

A current flow between the first terminal 29b of the amplifier transistor 29 and the second terminal 29c of the amplifier transistor 29 can be controlled by a signal or a potential applied to the control terminal 29a of the amplifier transistor 29. Such a signal for controlling the current flow between the terminals 29b, 29c can, e.g., be a voltage between a substrate of the amplifier transistor 29 and the control terminal 29a or a gate of the amplifier transistor 29 or the signal for controlling the current flow can, for example, be a current fed from a current source into the control terminal 29a of the transistor when the amplifier transistor 29 is implemented as a bipolar transistor. In addition to this, a current flow from the first terminal 27b of the cascode transistor 27 to the second terminal 27c of the cascode transistor 27 is controllable by a signal or a potential applied to the control terminal 27a of the cascode transistor 27. Such a signal for controlling the current flow between the terminals 27b, 27c can be a voltage between the control terminal 27a or the gate of the cascode transistor 27 and a substrate of the cascode transistor 27 or the signal for controlling the current flow between the terminals 27b, 27c can be a current fed from a current source into the control terminal 27a of the transistor 27 when the transistor 27 is implemented as a bipolar transistor.

A current I1 fed from the current source 26 into the base terminal 19a can control a current flow from the collector terminal 19b to the emitter terminal 19c. A current I2 fed into the second bipolar transistor 21 can control a current flow from the collector terminal 21b of the second bipolar transistor 21 to the emitter terminal 21c of the second bipolar transistor 21. The relation between a total current I supplied from the current source 26 and the currents I1, I2 is defined by the Kirchhoff-equation as follows: I=I1+I2. Hence, the division of the current I from the current source 26 into the currents I1, I2 sets the current flow between the terminals 19b, 19c and the current flow between the terminals 21b, 21c.

The first voltage source 25a provides a power supply for the cascode circuit 17 and for a circuit (not shown here) coupled to the output terminal 15. The second voltage source 25b provides a power supply for a series circuit of the first bipolar transistor 19 and the amplifier transistor 29.

In an embodiment of the amplifier 11, a signal generator coupled to the control terminal of the cascode transistor 27 generates a signal and thus controls the current flow between the first terminal 27b and the second terminal 27c of the cascode transistor 27. The signal generator can be controlled by a control circuit (not shown here). The control circuit can in parallel control the current source 26 and can be operated in two different modes: a high-gain mode and a gain-step mode.

1. High-Gain Mode

In the high-gain mode, the control circuit can control the signal generator delivering the signal at the control terminal 27a of the cascode transistor 27 so that, in the high-gain mode, the cascode transistor 27 is switched on or turned on such that a current can flow between the first terminal 27b and the second terminal 27c of the cascode transistor 27. Moreover, the control circuit controls the current source 26, such that the current source 26 is switched off or turned off during the high-gain mode. Thus, the current source 26 does not supply the current I, so that no current I1, I2 is fed into the first bipolar transistor 19 and the second bipolar transistor 21, such that the first bipolar transistor 19 and the second bipolar transistor 21 are turned off or are in an off-state during the high-gain mode.

The gain or the amplification of the amplifier 11 in the high-gain mode is solely defined by the operating point of the cascode transistor 27 and the operating point of the amplifier transistor 29, as the first bipolar transistor 19 and the second bipolar transistor 21 are turned off in this operating mode of the control circuit. Hence, the amplifier 11 operates as a cascode circuit during the high-gain mode. In other words, the amplification of the signal applied to the input terminal 13 or the ratio of a level of the signal at the output terminal 15 to a level of the signal at the input terminal 13 is only defined by the operating point of the cascode transistor 27 and the operating point of the amplifier transistor 29.

2. Gain-Step Mode

In the gain-step mode, the control circuit controls the signal generator coupled to the control terminal 27a of the cascode transistor 27, such that no signal is applied to the control terminal 27a and so that the cascode transistor 27 is turned off. The control circuit further controls the current source 26 such that the current I is supplied at the first terminal of the current source 26 and such that the current I1 or the current I2 is fed into the bipolar transistors 19, 21. Depending on the level of the signal at the input terminal 13 directly connected to the control terminal 29a, a current flow between the first terminal 29b and the second terminal 29c can be controlled, hence fixing a current at the emitter terminal 19c of the first bipolar transistor 19 such that the division of the current I into the currents I1, I2 is defined by this. Thus, the value of the current I1 depends on the level of the signal at the input terminal 13. As the value of the current I2 is defined by the equation I2=I−I1, the current I2 depends on the value of the current I1 and depends on the level of the signal applied to the input terminal 13. The second bipolar transistor 21 in turn sets the level of the signal at the output terminal 15 such that the level of the signal at the output terminal 15 depends on the value of the current I2 in the gain-step mode.

To summarize, the level of the output signal depends on the level of the input signal wherein the amplification of the input signal is defined by the operating points of the bipolar transistors 19, 21 and the operating point of the amplifier transistor 29. As the amplifier transistor 29 can be implemented as an LNA (LNA=Low Noise Amplifier) a noise figure of the amplifier 11 can be reduced.

Figure 2:
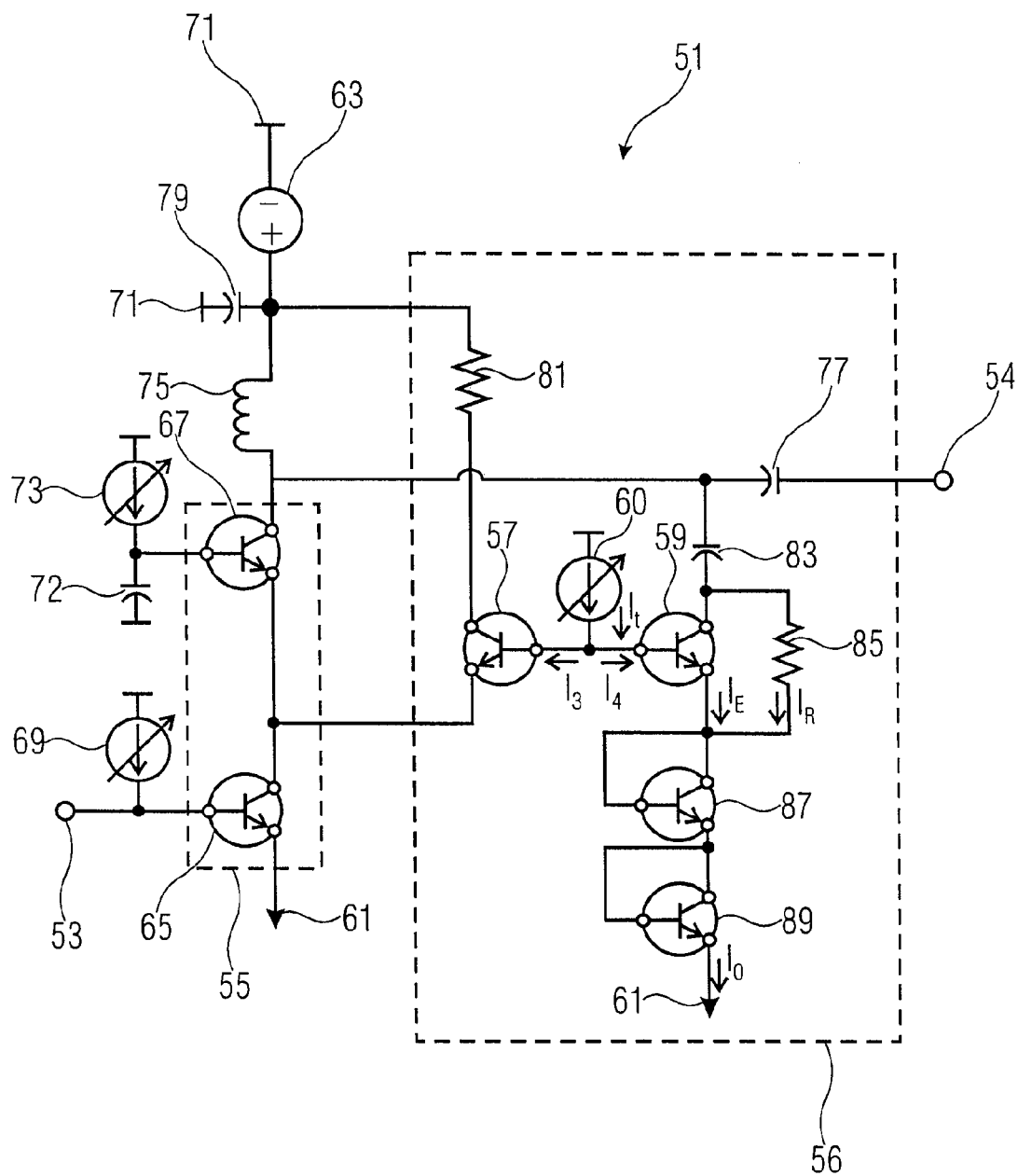
FIG. 2 depicts another amplifier according to an embodiment.

The function and the principle of the amplifier and the method for operating the amplifier can be understood also from the presentation and the description of a further amplifier 51, which is shown in FIG. 2. The further amplifier 51 comprises an input terminal 53, an output terminal 54, a cascode circuit 55 and a gain-step circuit 56 having a first bipolar transistor 57, a second bipolar transistor 59 and a gain-step circuit current source 60. The further amplifier additionally comprises a terminal 61 of a predefined potential and a DC supply voltage source 63.

The cascode circuit 55 has an amplifier transistor 65 and a cascode transistor 67, the amplifier transistor 65 and the cascode transistor 67 being connected in series such that an emitter terminal of the cascode transistor 67 is coupled to a collector terminal of the amplifier transistor 65. An emitter terminal of the amplifier transistor 65 is connected to the terminal 61 of the predefined potential, while the base terminal of the amplifier transistor 65 is connected to a first terminal of an amplifier current source 69 and the input terminal 53, wherein a second terminal of the amplifier current source 69 is connected to a ground terminal 71. A base terminal of the cascode transistor 67 is connected to a first terminal of a cascode capacitor 72, of which a second terminal is coupled to the ground terminal 71. Additionally, the base terminal of the cascode transistor 67 is connected to a first terminal of a cascode current source 73, of which a second terminal is connected to the ground terminal 71.

The collector terminal of the cascode transistor 67 is further coupled to a first terminal of an inductor 75 and a first terminal of an output capacitor 77, of which a second terminal is connected to the output terminal 54 and a second terminal of the inductor 75 is coupled to a first terminal of the DC supply voltage source 63, of which a second terminal is coupled to the ground terminal 71. A first terminal of a supply capacitor 79 is connected to the second terminal of the inductor 75 and a second terminal of the supply capacitor 79 is coupled to the ground terminal 71. Moreover, a first terminal of a supply resistor 81 is connected to the first terminal of the DC supply voltage source 63 and a second terminal of the supply resistor 81 is coupled to the collector terminal of the first bipolar transistor 57. An emitter terminal of the first bipolar transistor 57 is coupled to the collector terminal of the amplifier transistor 65, while a base terminal of the first bipolar transistor 57 is coupled to a first terminal of the gain-step circuit current source 60, of which a second terminal is connected to the ground terminal 71. Hence the first bipolar transistor 57 and the amplifier transistor 65 form a series circuit connected between the first terminal of the DC supply voltage source 63 and the terminal 61 of the predefined potential.

The first terminal of the gain-step circuit current source 60 is also connected to a base terminal of the second bipolar transistor 59 and a collector terminal of the bipolar transistor 59 is coupled to a first terminal of a gain-step circuit capacitor 83, of which a second terminal is coupled to the first terminal of the output capacitor 77. The second terminal of the output capacitor 77 is coupled to the output terminal 54. The collector terminal of the second bipolar transistor 59 is coupled to a first terminal of a gain-step circuit resistor 85, of which a second terminal is connected to an emitter terminal of the second bipolar transistor 59. The emitter terminal of the second bipolar transistor 59 is further coupled to a collector terminal of the first gain-step transistor 87 and a base terminal of the first gain-step transistor 87, whereas an emitter terminal of the first gain-step transistor 87 is coupled to a collector terminal of a second gain-step transistor 89 and to a base terminal of the second gain-step transistor 89. Apart from this, an emitter terminal of the second gain-step transistor 89 is coupled to the terminal 61 of the predefined potential.

The terminals of the capacitors 72, 73, 77, 79 can be shorted if an AC-signal of a high frequency is applied to them. Hence, the cascode capacitor 72 and the supply capacitor 79 serve to suppress an influence of an AC-signal at the terminals connected to the capacitors 72, 79, while the output capacitor 77 and the supply capacitor 79 serve to decouple the output terminal 54 from the effects of a DC-signal in the amplifier 51. The reason for this functionality is that the capacitors 72, 77, 79, 83 have a low reactance when AC-signals of a high frequency are applied to their terminals and a high reactance when AC-signals of a low frequency are applied to their terminals, or even form an isolating element when a DC-signal is applied to their terminals. Thus the base terminal of the cascade transistor 67 and the first terminal of the DC supply voltage source 63 can be supposed to be shorted to ground for signals of a high frequency, while the collector terminal of the second bipolar transistor 59 and the collector terminal of the cascode transistor 67 can be supposed to be directly connected to the output terminal for AC-signals of a high frequency and be isolated from the output terminal 54 for DC-signals.

In contrast to this, the inductor 75 serves to suppress the effect of an AC-signal at the collector terminal of the cascode transistor 67 on the first terminal of the DC supply voltage source 63, as the inductor 75 has a high reactance when a signal of a high frequency is applied to its terminals.

The amplifier current source 69 functions to set an operating point of the amplifier transistor 65 and the cascode current source 73, so as to set an operating point of the cascode transistor 67. The supply resistor 81 affects a voltage drop between the first terminal of the DC supply voltage source 63 and the collector terminal of the first bipolar transistor 57 such that a DC potential at the collector terminal of the cascode transistor 67 is different from the potential at the collector terminal of the first bipolar transistor 57. The transistors 87,

89, of which each has a base terminal shorted to the collector terminal of the same transistor function as diodes or are connected as diodes.

The current source 60 supplies a current It that is divided into a current I3 fed into the first bipolar transistor 57 and a current I4 fed into the second bipolar transistor 59. The division of the current It into the currents I3, I4 or a ratio of the current I3 to the current I4 depends on a potential at the emitter terminal of the first bipolar transistor 57. A current defined by the sum of the currents IE, IR: ID=IE+IR is fed into the diodes of the transistors 87, 89.

In an embodiment of the amplifier 51 shown in FIG. 2, a control circuit (not shown in FIG. 2) can control the current sources 60, 73 such that the gain-step circuit 56, which is implemented in a stage after the amplifier transistor 65, or the first stage LNA T1 is turned off in a high-gain mode, while the cascode current source 73 is turned on in the high-gain mode such that the cascode transistor 67 is turned on. In order to turn off the gain-step circuit 56, the gain-step current source 60 is turned off such that no current is fed into the bipolar transistors 57, 59 and they are, thus, turned off. In the high-gain mode, the amplifier 51 functions as a cascode circuit receiving its DC power supply from the DC supply voltage source 63 via the cascode transistor 67 or the cascode stage T2, wherein the power coupled to the output terminal 54 is set by the selection of the operating points of the transistors 65, 67 and a level of the signal at the input terminal 53.

In a gain-step mode, the control circuit controls the current source 73 such that the current source 73 is turned off and hence the cascode transistor 67 is turned off and in parallel controls the gain-step circuit current source 60 and such that the gain-step current source 60 is turned on and provides the current It. As the cascode transistor 67 is turned off in the gain-step mode, the power for the amplifier transistor 65 is solely supplied via the first bipolar transistor 57.

A signal at the input terminal, such as an AC signal or an AC voltage between the ground terminal and the input terminal 53, controls a current flow between the collector terminal and the emitter terminal of the amplifier transistor 65 and hence the current at the emitter terminal of the bipolar transistor 57. Because the current at the emitter terminal of the first bipolar transistor 57 depends on the level of the signal at the input terminal 53, the current I3 fed into the first bipolar transistor 57 depends on the level of the signal at the input terminal 53, while the current I4 is defined by the equation I4=It–I3 so that the current I4 fed into the second bipolar transistor 59 at its base terminal depends on the level of the signal at the input terminal 53.

The current I4, in turn, controls a current flow through the second bipolar transistor 59 or the current between the collector terminal and the emitter terminal of the second bipolar transistor 59. Hence, a current IE at the emitter terminal of the transistor 59 depends on the level of the signal at the input terminal 53 thus influencing a voltage drop between the collector terminal and the emitter terminal of the second bipolar transistor 59 such that the voltage between the output terminal 54 and the terminal of the predefined potential 61 depends on a level of the signal at the input terminal 53. Hence, the signal at the output terminal 54 is alternated depending on the level of the AC-signal at the input terminal 53 such that the signal or the AC-signal at the output terminal 54 represents the amplified signal or the amplified AC-signal at the input terminal 53.

The power for the output signal is supplied from the DC supply voltage source 63 and the gain-step circuit current source 60. The power thus is delivered through the base-emitter diode of the first bipolar transistor 57 and the base-collector diode of the second bipolar transistor 59 to the output terminal 54 wherein the amplification of the input signal or the signal at the input terminal 53 depends on the characteristics of the first bipolar transistor 57 and the second bipolar transistor 59. In other words, the out-coupled power depends on the size or the characteristics of the base-emitter diode of the first bipolar transistor 57 and the characteristics of the base-collector diode of the second bipolar transistor 59 while the voltage drop between the emitter terminal and the collector terminal of the second bipolar transistor 59 defines the current IE and the current IR, and both currents IE, IR determine the current ID fed into the transistors 87, 89, which are connected as diodes as already outlined above.

Summarizing the functionality of the gain-step circuit 56, the amplification or the gain of the amplifier 51 in the gain-step mode depends on the characteristics of the base-emitter diode of the first bipolar transistor 57, the characteristics of the base-collector diode of the second bipolar transistor 59, the resistance of the supply resistor 81 determining the current through the base-emitter diode of the first bipolar transistor 57 and the base-collector diode of the second bipolar transistor 59, and the resistance of the gain-step resistor 85. Therefore the gain or the amplification of the amplifier 51 in the gain-step mode can be adjusted or changed by adjusting the values of the mentioned elements.

In other words, in the gain-step mode, the power is coupled to the gain-step circuit 56 by the base-emitter diode of the first bipolar transistor 57 and coupled out by the base-collector diode of the second bipolar transistor 59 after the signal at the input terminal 53 has already been amplified by the amplifier transistor 65 or the low-noise amplifier. Thus, the functionality of the amplifier transistor 65 is not, or only slightly affected, by the function of the gain-step circuit 56 when the gain-step circuit 56 is off or the gain-step circuit current source 60 is turned off, e.g., in the high-gain mode. The gain-step circuit 56 is arranged in the amplifier 51 in a stage after the amplifier transistor 65 or the LNA and has characteristics that are similar to the characteristic of the cascode transistor 67 when the cascode transistor 67 is operated in the high-gain mode. In an embodiment of the amplifier 51, a ratio of a noise figure of the cascode transistor 67 to a noise figure of the gain-step circuit 56 in a frequency range from 0.8 GHz to 2.2 GHz can be in a range from 0.5 to 2, while a ratio of the gain of the amplifier 51 in the gain-step mode to a gain of the amplifier 51 in the high-gain mode can be in a range from 0.5 to 2. However, the values are merely for illustrative purposes. From a different perspective, the whole circuit may be, for example, designed such that noise figures from 1.5 dB to 3 dB and a gain from 10 dB to –3 dB are possible with this circuit.

In a cascade of several amplifier stages, according to an embodiment, the total noise figure of the cascaded amplifiers mainly is determined by the noise figure of the first amplifier stage, hence the overall noise figure of the amplifier 51 can be kept low due to the fact that the amplifier transistor 65 can be implemented as an LNA. The characteristics or the parameters of the amplifier 51 and its elements can be selected such that the input matching or the input impedance of the amplifier 51 is only changed within predefined tolerances when switching the amplifier from the high-gain mode to the gain-step mode. As an example only, a ratio of the input impedance of the amplifier 51 in the high-gain mode to the input impedance of the amplifier 51 in the gain-step mode may be in a range from 0.5 to 2.

The parameters of the gain-step circuit 56 and especially the characteristics of the bipolar transistors 57, 59, the transistors 87, 89 or the resistance of the supply resistor 81 or the gain-step resistor 85 can be selected such that the output matching or the output impedance of the amplifier 51 in a high-gain mode can be equal to the output matching or the output impedance of the amplifier 51 in the gain-step mode within predefined tolerances. Thus, a ratio of the output impedance of an amplifier 51, according to an embodiment in the high-gain mode, to the output impedance of the amplifier 51 in a gain-step mode, can be in a range from 0.5 to 2. In other words, in the amplifier 51, the output matching of the gain-step circuit 56 can be similar to the output matching of the cascode stage. Therefore, the amplifier 51 can be easily matched to a following amplifier stage in a cascade of several amplifiers in an amplifier circuit. Hence the amplifier 51 is characterized by a lower noise figure while it can be better matched within a cascade of amplifiers to an amplifier stage connected upstream to the amplifier 51 or an amplifier stage connected downstream to the amplifier 51.

The amplifier 51 can be implemented in a circuit of a device used for mobile telecommunication in order to improve the quality of the received signal. The amplifier 51 according to an embodiment can thus be used in devices for a high data rate wireless communication via the UMTS—(UMTS=universal-mobile-telephone-system) protocol, the HSPDA (HSDPA=high-speed-data-packet-access) protocol, and the WLAN (WLAN=wireless local access network) protocol due to its low noise figure. The amplifier 51, according to an embodiment, can be used in a circuit to handle a large range of power levels received at the input terminal in a mobile phone application, wherein the level of the signal at the input terminal 53 can depend on a distance of the hand-held or the mobile phone to a base station.

In an embodiment of the amplifier 51, the gain of the amplifier 51 can be adjusted by switching the amplifier 51 from the high-gain mode to the gain-step mode. In the gain-step mode, the behavior of the amplifier 51 depends on the behavior of the LNA and the gain-step circuit 56. The thus implemented gain-step circuit 56 can have thus three functionalities: a low amplification or even an attenuation when the level of the signal received at the input terminal 53 is high, a high power-handling capability, or an operation in a high-gain mode when the level of the signal at the input terminal 53 is below a predefined threshold, wherein the parameters of the gain-step circuit 56 can be selected such that the gain-step circuit 56 can operate together with the LNA without affecting the performance of the LNA or only affecting the performance of the LNA in predefined tolerances.

According to an embodiment, in the amplifiers 11, the transistors 27, 29 are FET-transistors (FET=field-effect transistor). However, in alternative embodiments of the amplifiers 11, bipolar transistors are also feasible. In addition to this, a current between the terminals 27a, 27b or 29a, 29b can be controlled by a voltage between the ground terminal and the control terminals 27a, 29a or the gate terminals 27a, 29a. However, in case the FET-transistors 27, 29 are replaced by bipolar transistors, a current source can be used to control a current flow between the terminals 27a, 27b or the terminals 29a, 29b. Further, the bipolar transistors 65, 67 could be replaced by FETs in a further embodiment of the amplifiers 51, if the current flow through them would be controlled by a potential at their gates or a voltage drop between the gates and the substrates of the respective FETs.

In the amplifiers 11, 51 according to an embodiment, the transistors 19, 21, 57, 59 comprise npn-bipolar transistors (npn-bipolar transistor=n-doped, p-doped, n-doped bipolar transistor). However, pnp-bipolar transistors (pnp-bipolar transistor=p-doped, n-doped, p-doped-bipolar transistor) are alternatives hereto, as long as the base cells or base regions of the transistors 19, 21 or 57, 59 have the same first type of conductivity or have a dopant of a first type of conductivity and the collector cells or the collector regions and the emitter cells or the emitter regions of the transistors 19, 21 or the transistors 57, 59 comprise a zone or a region of a second conductivity type opposite to the first conductivity type. In the amplifiers 11, 51, the terminals of several elements are connected to the ground terminal, which can be replaced by a terminal of a predefined potential in the amplifiers 11, 51.

Apart from this, in the amplifier 11 the power supply circuit 25 could be alternatively implemented such that one of the voltage sources 25a, 25b could be left out and instead the open remaining terminal could be connected via an ohmic resistor to the second terminal of the remaining voltage source. This means, if the first voltage source 25a were left out, the first terminal of the cascode transistor 27 would be connected via an ohmic resistor to the first terminal of the second voltage source 25b or, if the second voltage source 25b were left out, the collector terminal of the first bipolar transistor 19 would be connected via an ohmic resistor to the first terminal of the first voltage source 25a.

In the amplifier 51 the capacitors 72, 77, 79, 83 can have arbitrary capacitances or, in an alternative embodiment of the amplifier 51, the capacitors can even be left out wherein, in a further embodiment of the amplifier 51, the capacitances of the capacitors 72, 77, 79 or the capacitor 83 can, for example, be in a range from about 100 pF to about 100 nF. In the amplifier 51 the inductor 75 can have arbitrary inductances or, in an alternative embodiment of the amplifier 51, even be left out. The inductance of the inductor 75 can, for example, be in an amplifier 51 according to an embodiment be in a range from about 10 μH to about 10 mH. In the amplifier 51, the resistor 81 or the resistor 85 can have a resistance in a range from about 100 Ohm to about 10 kOhm, however any resistances of the resistor 81 or the resistor 85 are possible alternatives. In a further embodiment of the amplifier 51 according to an embodiment, the resistor 85 can even be completely left out.

In the amplifier 51 the bipolar transistors 87, 89 are connected as diodes. However, in an alternative embodiment, the bipolar transistors 87, 89 can be replaced by diodes such that, for example, a series circuit of the both bipolar transistors 87, 89 is replaced by a series circuit of two diodes, wherein the diodes can have the same functionality as the base-emitter diodes of the bipolar transistors 87, 89.

The amplifiers 11, 51 can have a noise figure in the range from about 1.5 dB to about 4 dB or about 2.5 dB in the gain-step mode in a frequency range from about 0.8 GHz to about 2.2 GHz and can have a gain of about 1 dB to about 6 dB or to about 2 dB in the gain-step mode. However, in a further embodiment of the amplifiers 11, 51 the noise figures or the gain can have arbitrary values. Apart from this, the amplifiers 11, 51, according to an embodiment, can be used in an WLAN-application, a UMTS-application or an HSDPA-application, like an HSDPA-portable phone or a portable communicator, however any applications of the amplifiers 11, 51 according to an embodiment are feasible.

What is claimed is:
1. An amplifier, comprising:
an input terminal;
an output terminal;
a cascode circuit comprising a first transistor and a second transistor serially coupled between the output terminal and a terminal of a predefined potential, with a control terminal of the first transistor being coupled to the input terminal;

a first bipolar transistor having a collector/emitter path forming, along with the first transistor, a series circuit coupled to the terminal of the predefined potential;

a power supply circuit for providing power supply voltages to the cascode circuit and the series circuit; and a second bipolar transistor coupled between the output terminal and the terminal of the predefined potential, wherein bases of the first bipolar transistor and the second bipolar transistor are coupled to each other and a current source.

2. The amplifier according to claim 1, further comprising a control circuit, the control circuit being adapted to turn on the second transistor of the cascode circuit and to turn off the first and the second bipolar transistor in the case of the amplifier being in a high-gain mode and to turn off the second transistor of the cascode circuit and to turn on the first bipolar transistor and the second bipolar transistor in the case of the amplifier being in a gain-step mode.

3. The amplifier according to claim 2, wherein the control circuit comprises the current source, a terminal of which is coupled to the bases of the first bipolar transistor and the second bipolar transistor, the current source being adapted to feed a current to the first bipolar transistor or the second bipolar transistor when the amplifier is in the gain-step mode and not to feed a current to the first bipolar transistor or the second bipolar transistor when the amplifier is in the high-gain mode.

4. The amplifier according to claim 2, wherein the control circuit comprises a cascode current source, the cascode current source being coupled to a control terminal of the second transistor of the cascode circuit and being adapted to feed a current into the second transistor of the cascode circuit when the amplifier is in the high-gain mode and not to feed a current into the second transistor of the cascode circuit when the amplifier is in the gain-step mode.

5. The amplifier according to claim 1, wherein the second transistor of the cascode circuit comprises a cascode bipolar transistor having a base terminal, a collector terminal and an emitter terminal, the collector terminal of the cascode bipolar transistor being coupled to the output terminal and the emitter terminal of the cascode bipolar transistor being coupled to an emitter terminal of the first bipolar transistor.

6. The amplifier according to claim 1, wherein the first transistor of the cascode circuit comprises an amplifier bipolar transistor having a base terminal, a collector terminal and an emitter terminal, the base terminal being coupled to the input terminal, the collector terminal being coupled to the emitter terminal of the first bipolar transistor and the emitter terminal of the first bipolar transistor being coupled to the terminal of the predefined potential.

7. The amplifier according to claim 1 further comprising an ohmic resistor having a first terminal and a second terminal, wherein the first terminal of the ohmic resistor is coupled to an emitter terminal of the second bipolar transistor and the second terminal of the ohmic resistor is coupled to a collector terminal of the second bipolar transistor.

8. The amplifier according to claim 1, further comprising an ohmic supply resistor having a first terminal and a second terminal, wherein the first terminal of the ohmic supply resistor is coupled to a terminal of the power supply circuit and the second terminal of the ohmic supply resistor is coupled to the collector terminal of the first bipolar transistor.

9. The amplifier according to claim 1, further comprising an output bipolar transistor having an emitter terminal, a base terminal and a collector terminal, wherein the base terminal of the output amplifier is coupled to the collector terminal of the output amplifier, the emitter terminal of the second bipolar transistor is coupled to the collector terminal and the emitter terminal of the output bipolar transistor is coupled to the terminal of the predefined potential.

10. The amplifier according to claim 1, further comprising a constant voltage source, wherein the constant voltage source is coupled between a ground terminal and the collector terminal of the first bipolar transistor.

11. The amplifier according to claim 6, further comprising an amplifier transistor current source, wherein a terminal of the amplifier transistor current source is coupled to a base terminal of the amplifier bipolar transistor such that an operating point of the amplifier bipolar transistor is controllable by means of a current fed from the amplifier transistor current source into the amplifier bipolar transistor.

12. The amplifier according to claim 1, wherein the amplifier is adapted to operate in a frequency range from about 0.8 GHz to about 2.2 GHz with a noise figure in a range from about 1.5 dB to about 4 dB in an operating range.

13. The amplifier according to claim 1, wherein the first bipolar transistor and the second bipolar transistor are of the same type such that the bases of the first bipolar transistor and the second bipolar transistor are implemented in a doped region of a first type of conductivity, while the emitters and collectors are implemented in a doped region of a second type of conductivity opposite to the first type of conductivity, and wherein both bipolar transistors are coupled to each other such that the base emitter diode of the first bipolar transistor and the base emitter diode of the second bipolar transistor are coupled in series with a reverse polarity.

14. The amplifier according to claim 1, wherein the first bipolar transistor comprises an npn-transistor and the second bipolar transistor comprises an npn-transistor.

* * * * *